(12) United States Patent
Kobayashi et al.

(10) Patent No.: US 9,507,280 B2
(45) Date of Patent: Nov. 29, 2016

(54) PRINTER

(75) Inventors: Motoki Kobayashi, Shizuoka (JP); Hidetoshi Sato, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 214 days.

(21) Appl. No.: 14/123,165

(22) PCT Filed: Apr. 5, 2012

(86) PCT No.: PCT/JP2012/002381
§ 371 (c)(1),
(2), (4) Date: Feb. 5, 2014

(87) PCT Pub. No.: WO2012/164805
PCT Pub. Date: Dec. 6, 2012

(65) Prior Publication Data
US 2014/0307236 A1 Oct. 16, 2014

(30) Foreign Application Priority Data
May 31, 2011 (JP) .................... 2011-121710

(51) Int. Cl.
*B41F 35/00* (2006.01)
*G03F 7/20* (2006.01)
*H05K 3/12* (2006.01)
*B41F 15/36* (2006.01)
*H05K 3/34* (2006.01)

(52) U.S. Cl.
CPC ........... *G03F 7/70925* (2013.01); *B41F 15/36* (2013.01); *B41F 35/003* (2013.01); *H05K 3/1216* (2013.01); *H05K 3/3484* (2013.01)

(58) Field of Classification Search
CPC .. B41F 35/003; B41F 35/004; B41F 35/005; B41F 35/00
See application file for complete search history.

(56) References Cited

U.S. PATENT DOCUMENTS

| 5,988,060 A * | 11/1999 | Asai ................. H05K 3/1233 101/123 |
| 6,234,080 B1 | 5/2001 | Tani |
| 6,237,484 B1 * | 5/2001 | Homma ............... B41F 35/005 101/114 |
| 2001/0029851 A1 * | 10/2001 | Murakami ........... B41F 15/085 101/126 |
| 2002/0019680 A1 * | 2/2002 | Nishikawa .......... B41F 15/0813 700/121 |

(Continued)

FOREIGN PATENT DOCUMENTS

| CN | 1252351 A | 5/2000 |
| CN | 1846995 A | 10/2006 |

(Continued)

OTHER PUBLICATIONS

International Search Report; PCT/JP2012/002381; Jul. 24, 2012.

(Continued)

*Primary Examiner* — David Banh
(74) *Attorney, Agent, or Firm* — Studebaker & Brackett PC

(57) ABSTRACT

A printer includes: a mask; a cleaning section configured to perform cleaning of the mask by movement relative to the mask in a predetermined direction parallel with an under surface of the mask; a mask holding section capable of turning the mask about an axis perpendicular to the under surface of the mask while holding the mask; and a control section configured to perform a control such that the cleaning is performed on the mask placed in a predetermined position about the axis.

16 Claims, 6 Drawing Sheets

(56) References Cited

U.S. PATENT DOCUMENTS

| | | | |
|---|---|---|---|
| 2004/0124230 A1 | 7/2004 | Hertz et al. | |
| 2005/0183594 A1 | 8/2005 | Perault et al. | |
| 2009/0199729 A1* | 8/2009 | Aiba | B41F 15/26 101/129 |
| 2011/0061549 A1* | 3/2011 | Nishi | B41F 35/005 101/114 |
| 2011/0315033 A1* | 12/2011 | Tanaka | B41F 35/005 101/425 |
| 2012/0000380 A1* | 1/2012 | Tanaka | B41F 35/005 101/114 |
| 2012/0201587 A1* | 8/2012 | Kato | B41F 33/0036 400/76 |
| 2013/0087057 A1* | 4/2013 | Kondo | H05K 3/1233 101/123 |
| 2014/0000468 A1* | 1/2014 | Perault | B41F 35/005 101/425 |
| 2014/0020578 A1* | 1/2014 | Sumioka | B41F 15/44 101/123 |
| 2014/0020579 A1* | 1/2014 | Sumioka | B41F 15/44 101/123 |
| 2014/0083359 A1* | 3/2014 | Miyake | B41F 15/08 118/697 |
| 2014/0102322 A1* | 4/2014 | Tomomatsu | B41F 15/08 101/123 |

FOREIGN PATENT DOCUMENTS

| | | |
|---|---|---|
| CN | 1922015 A | 2/2007 |
| EP | 0993948 A1 | 4/2000 |
| JP | H02-253956 A | 10/1990 |
| JP | H09-193362 A | 7/1997 |
| JP | 2718492 B2 | 2/1998 |
| JP | 10-180981 A | 7/1998 |
| JP | 2000-168055 A | 6/2000 |
| JP | 2001-293842 A | 10/2001 |
| JP | 2004-136569 A | 5/2004 |
| JP | 2006-289784 A | 10/2006 |
| JP | 1846995 A | 10/2006 |
| JP | 2010-158871 A | 7/2010 |
| WO | WO2011136178 * 11/2011 | B41F 15/44 |

OTHER PUBLICATIONS

The extended European search report issued by the European Patent Office on Oct. 22, 2014, which corresponds to European Patent Application No. 12794071.6-1806 and is related to U.S. Appl. No. 14/123,165.

* cited by examiner

PRINTER

This application is based upon Japanese Patent Application No. 2011-121710 filed on May 31, 2011, and International Patent Application No. PCT/JP2012/002381 filed on Apr. 5, 2012, the content of each of which is incorporated herein by reference.

FIELD OF THE DISCLOSURE

The present disclosure relates to a printer, and more particularly to a printer provided with a cleaning section for cleaning a mask.

BACKGROUND

Conventionally known printers include printers of the type provided with a cleaning section for cleaning a mask, as disclosed in Japanese Patent Publication No. 2718492, for example.

Japanese Patent Publication No. 2718492, discloses a printer provided with a cleaning device (cleaning section) which is configured to clean a fixedly placed mask by moving in a predetermined direction while abutting against an under surface of the mask. In this printer, the mask is shaped rectangular in plan view and the cleaning device (cleaning section) performs cleaning of the mask by moving in a direction parallel with a pair of lateral sides of the mask.

With the printer of Japanese Patent Publication No. 2718492, having the cleaning device (cleaning section) which cleans the mask, moves in a constantly fixed direction, parallel with the mask. However, it is conceivable that some opening patterns of the mask cannot be effectively cleaned.

SUMMARY

The present disclosure has been made to solve the problem described above. An object of the present disclosure is to provide a printer which is capable of cleaning the mask more effectively.

A printer according to one aspect of the present disclosure includes: a mask; a cleaning section configured to perform cleaning of the mask by movement relative to the mask in a predetermined direction parallel with an under surface of the mask; a mask holding section capable of displacing the mask about an axis perpendicular to the under surface of the mask while holding the mask; and a control section configured to control the mask holding section in such a manner that the cleaning is performed on the mask placed in a predetermined position about the axis.

BEST MODE FOR CARRYING OUT THE DISCLOSURE

Hereinafter, embodiments of the present disclosure will be described with reference to the drawings.

The structure of a printer 100 according to one embodiment of the present disclosure will be described with reference to FIGS. 1 to 6.

Figure 1:
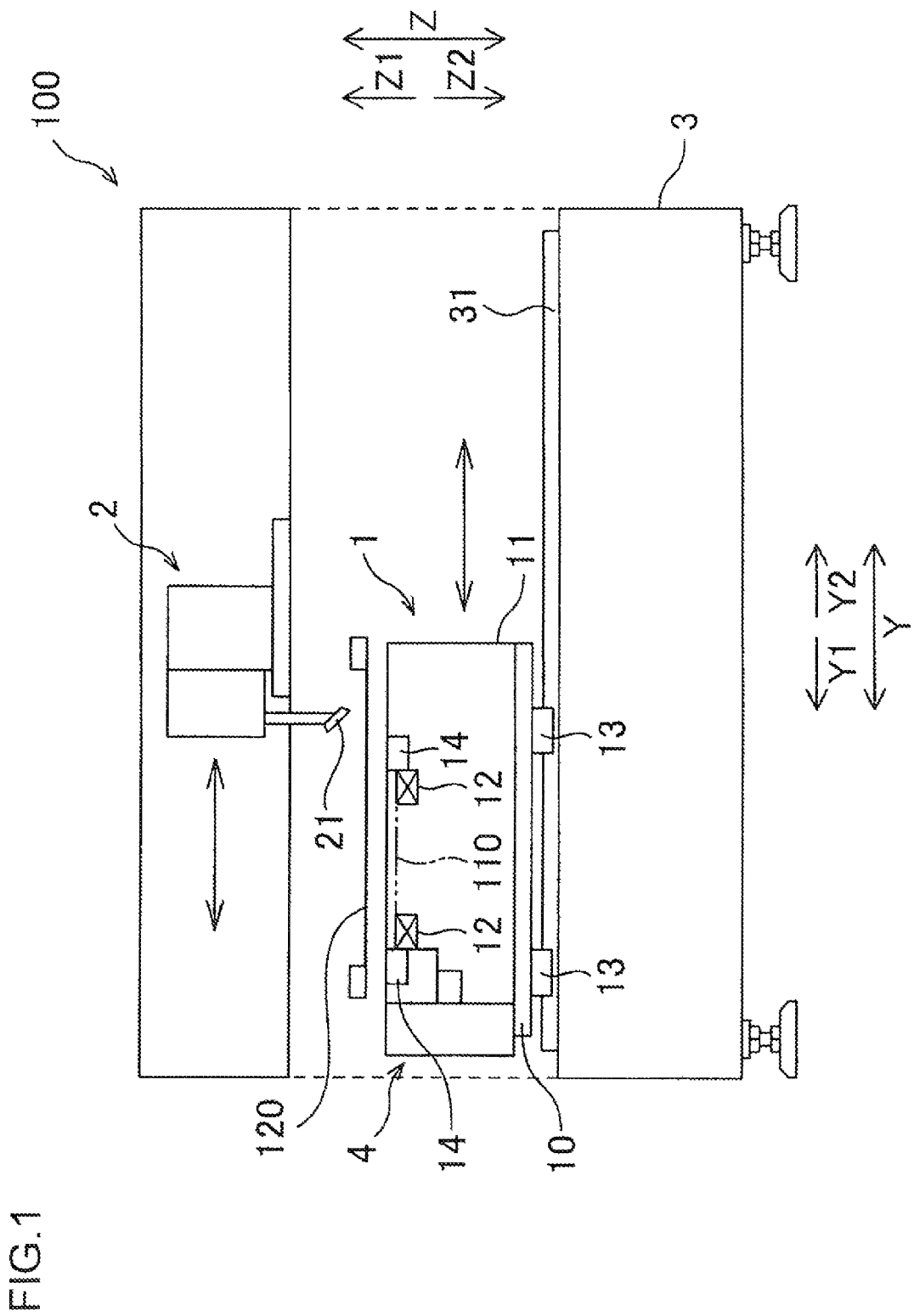
FIG. 1 is a schematic view illustrating the overall structure of a printer according to one embodiment of the present disclosure.

The printer 100 according to the present embodiment has the function of solder printing on a substrate 110. As shown in FIG. 1, the printer 100 includes a substrate support table 1 and a printing mechanism section 2 disposed above (in Z1-direction from) the substrate support table 1.

The substrate support table 1 includes a base member 10, a body portion 11, and a pair of conveyors 12. The body portion 11 is supported on the base member 10 for movement in the X-direction and is designed to be driven in the X-direction by a non-illustrated driving device. The base member 10 is disposed so as to be movable along a rail portion 31 by means of sliders 13 fixed to the underside of the base member 10. The rail portion 31 being mounted on a support bed 3 and extending in the Y-direction. That is, the body portion 11 is movable in the Y-direction together with the base member 10.

The conveyors 12 are disposed on the body portion 11 and move in the Y-direction together with the body portion 11 as the body portion 11 moves in the Y-direction. The conveyors 12 have the function of conveying the substrate 110 in a horizontal direction (X-direction) perpendicular to the Y-direction.

The printing mechanism section 2 is designed to be movable in the Y-direction independently of the substrate support table 1. The printing mechanism section 2 has the function of feeding solder paste onto a top surface of a mask 120 placed over the substrate 110. The printing mechanism section 2 is also designed to reciprocate in the Y-direction in order for solder paste that has been fed onto the mask 120 to be spread over the mask 120 by means of a squeegee 21. Thus, the printing mechanism section 2 prints the solder paste on the top surface of the substrate 110 through a non-illustrated opening portion formed in an opening region 120a of the mask 120 (see FIGS. 4 and 5).

Figure 2:
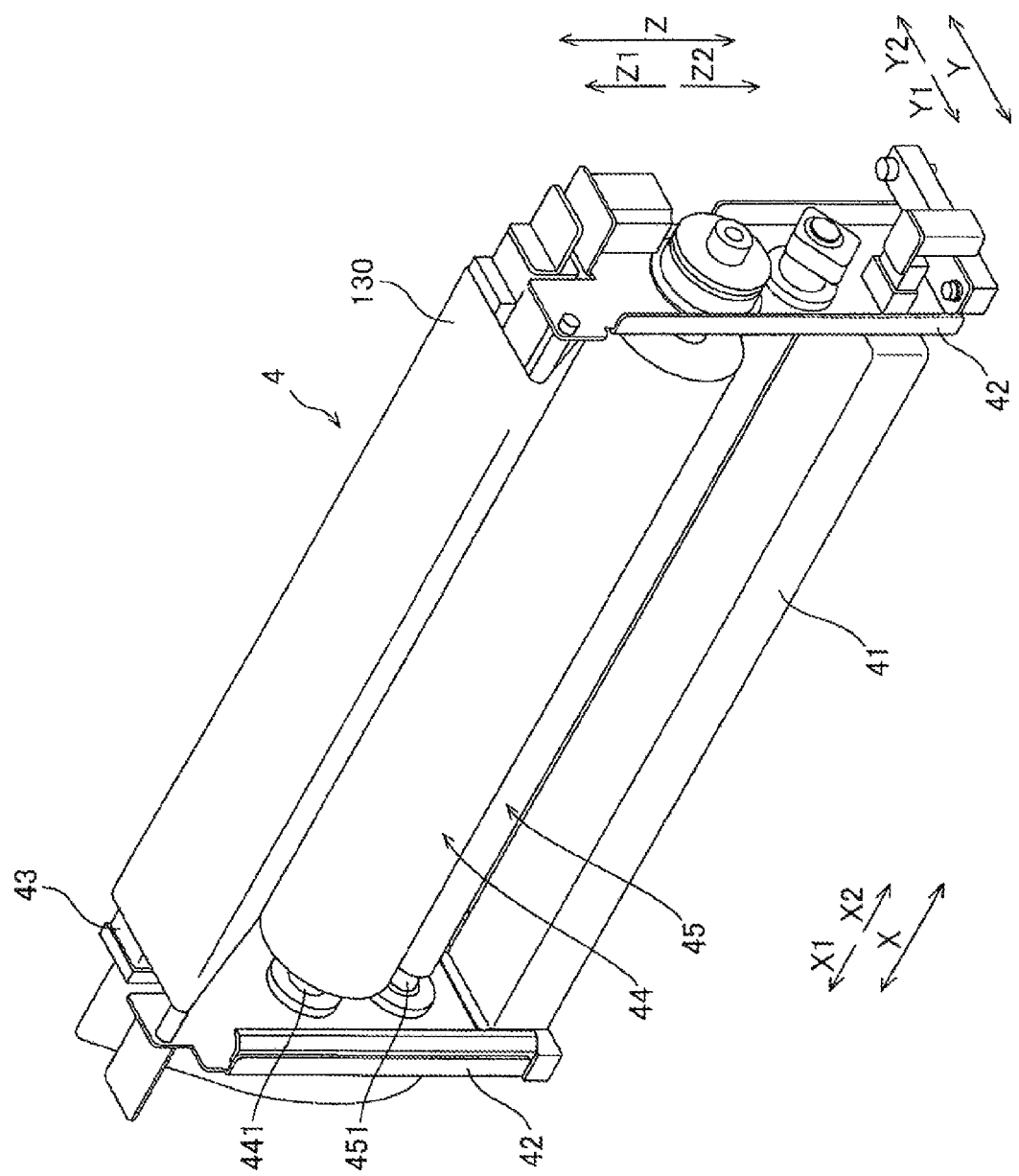
FIG. 2 is a perspective view illustrating a cleaner section of the printer.

As shown in FIG. 1, the substrate support table 1 has a cleaner section 4 (equivalent to the cleaning section defined by the present disclosure) for cleaning the mask 120 in a portion on a front side (Y-direction side). The cleaner section 4 serves to remove unnecessary solder paste that adheres to the mask 120 in printing solder paste on the substrate 110. The cleaner section 4 is designed to move in the Y-direction together with the substrate support table 1 as the substrate support table 1 moves in the Y-direction. As shown in FIG. 2, the cleaner section 4 includes a base portion 41 extending in the X-direction, a pair of sidewall portions 42 disposed at opposite ends of the base portion 41 in the X-direction, a cleaning head portion 43 disposed at an upper end portion of the cleaner section 4 and extending in the X-direction, a sheet feeding portion 44 around which a cleaning sheet 130 in an unused condition is rolled, a sheet recovery portion 45 around which the cleaning sheet 130 in a used condition is to be rolled, and a suction unit 46 (see FIG. 6).

Figure 6:
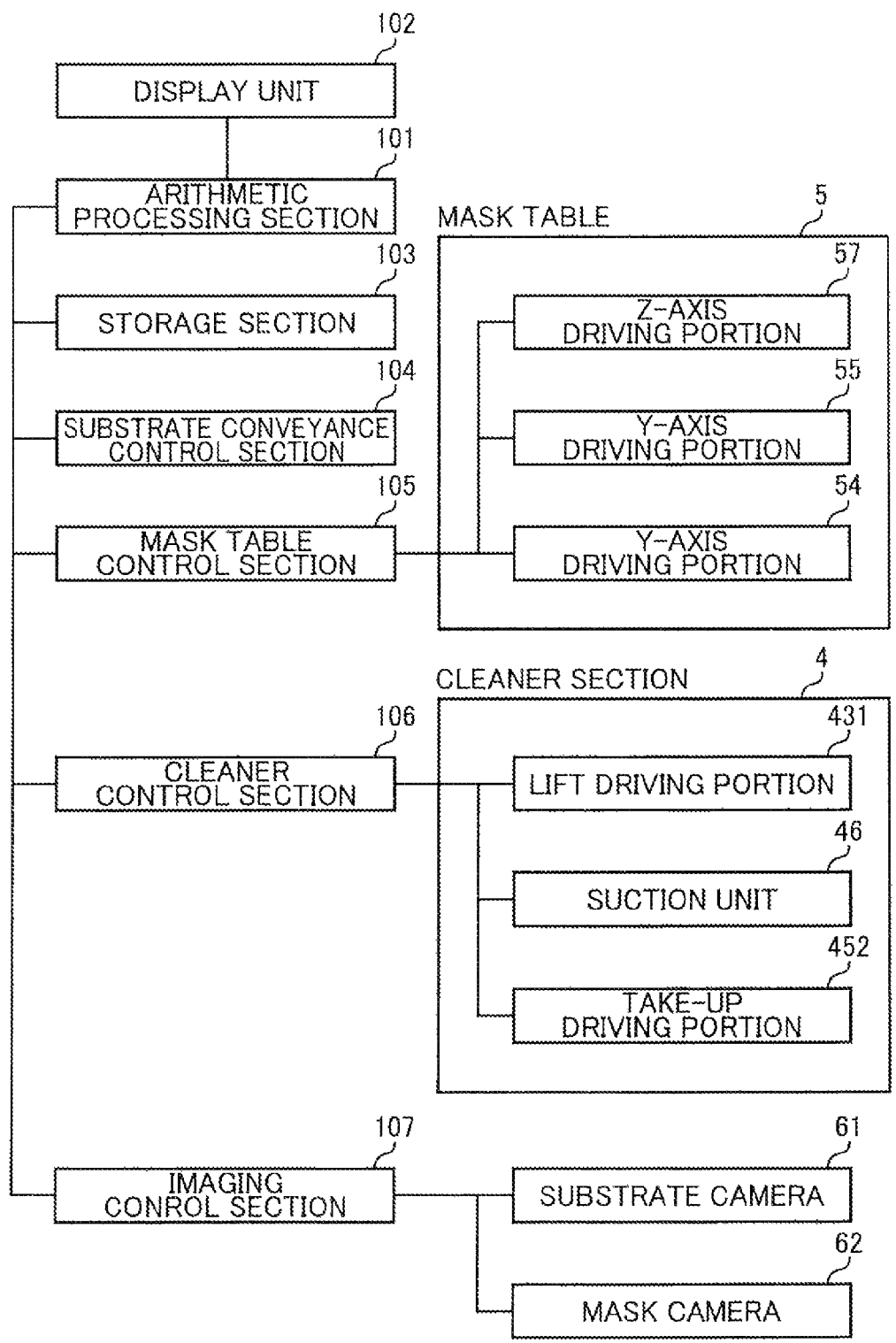
FIG. 6 is a block diagram illustrating the overall configuration of the printer.

The cleaning head portion 43 is designed to be vertically movable (in the Z-direction) by means of a lift driving portion 431 (see FIG. 6). The cleaning head portion 43 is adapted to abut against the under surface of the mask 120 through the cleaning sheet 130 by moving upwardly in cleaning the mask 120. The sheet feeding portion 44 has a shaft portion 441 which is supported at opposite ends thereof by the pair of sidewall portions 42 and which extends in the X-direction. The unused cleaning sheet 130 is rolled around the shaft portion 441. The sheet recovery portion 45 has a shaft portion 451 which is supported at opposite ends thereof by the pair of sidewall portions 42 and which extends in the X-direction. The shaft 451 is designed to take up the used cleaning sheet 130 therearound by being rotated by a take-up driving portion 452 (see FIG. 6). The suction unit 46 has the function of attracting the mask 120 by suction through the cleaning sheet 130 in contact with the mask 120 and a plurality of non-illustrated suction holes provided in the cleaning head portion 43 thereby depositing the solder paste adhering to the under surface of the mask 120 onto the cleaning sheet 130 by suction. The cleaning sheet 130 is formed from a fabric material having flexibility and air permeability. The cleaning sheet 130 may also be formed from a material other than fabric, such as a paper or leather material.

The cleaner section 4 is configured to clean the mask 120 by moving in the Y-direction with the cleaning sheet 130 in a state of being pressed against the under surface of the mask 120. That is, the cleaner section 4 is designed to wipe off the solder paste adhering to the mask 120 with the cleaning sheet 130 moving in the Y-direction. In cleaning the mask 120, the cleaner section 4 rolls the cleaning sheet 130 onto the sheet recovery portion 45 in such a manner that the cleaning sheet 130 passes over the cleaning head portion 43. By so doing, the cleaner section 4 can clean the mask 120 by using the unused cleaning sheet 130 continuously fed from the sheet feeding portion 44. In cleaning the mask 120, the cleaner section 4 is also designed to wipe off the solder paste with the cleaning sheet 130 while attracting the solder paste by suction by the suction unit 46 (see FIG. 6), thereby to hold the wiped-off solder paste at opening portions formed among fibers which serve as air paths of the cleaning sheet 130.

The cleaner section 4 is also designed to clean the mask 120 by moving along the under surface of the mask 120 rearwardly (in Y2-direction) relative to the mask 120 and then further clean the mask 120 by moving along the under surface of the mask 120 forwardly (in Y1-direction) relative to the mask 120. That is, the cleaner section 4 is designed to move from the front side (Y1-direction side) toward the rear side (Y2-direction side) to clean the mask 120 and, continuously therewith or at a next occasion of cleaning, move from the rear side (Y2-direction side) toward the front side (Y1-direction side) to clean the mask 120.

The printer 100 further includes a mask table 5 supporting the mask 120 between the substrate support table 1 and the printing mechanism section 2. Description will be made of the structure of the mask table 5 with reference to FIGS. 3 to 5. The mask table 5 is one example of the "mask holding section" defined by the present disclosure.

Figure 3:
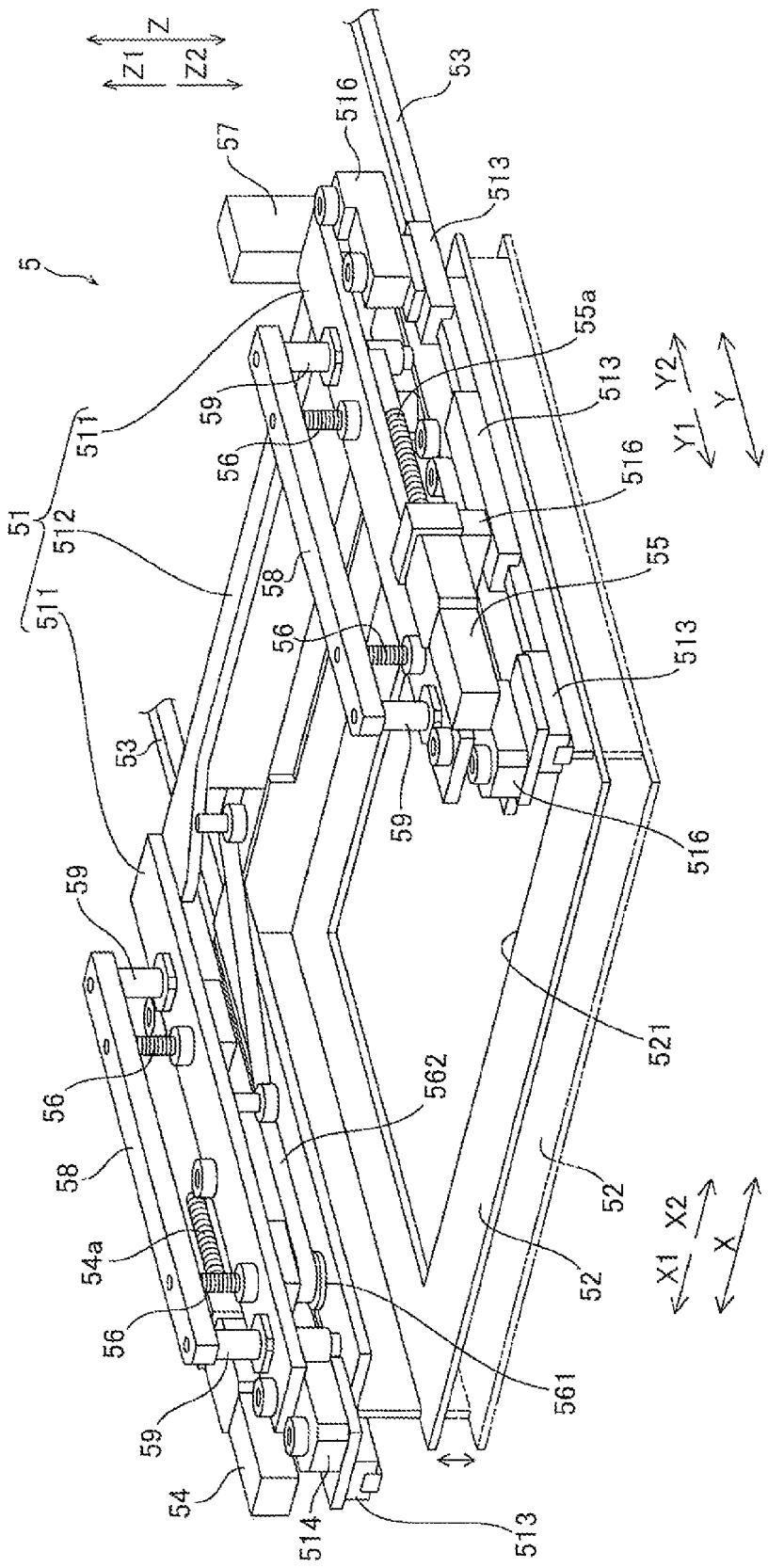
FIG. 3 is a perspective view illustrating a mask table of the printer.

As shown in FIG. 3, the mask table 5 has a main portion 51 and a mask support plate 52 supported by the main portion 51. The main portion 51 is substantially U-shaped in plan view. Specifically, the main portion 51 has a pair of Y-axis plate portions 511 extending in the Y-direction and an X-axis plate portion 512 interconnecting Y2-direction end portions of the pair of Y-axis plate portions 511. The main portion 51 is supported on a pair of rails 53 extending in the Y-direction by means of sliders 513 and hence is movable along the pair of rails 53 in the Y-direction. The rails 53 are fixed to a non-illustrated frame member of the printer 100.

The main portion 51 is pivotally movable in plan view (about an axis parallel with the Z-direction).

Figure 4:
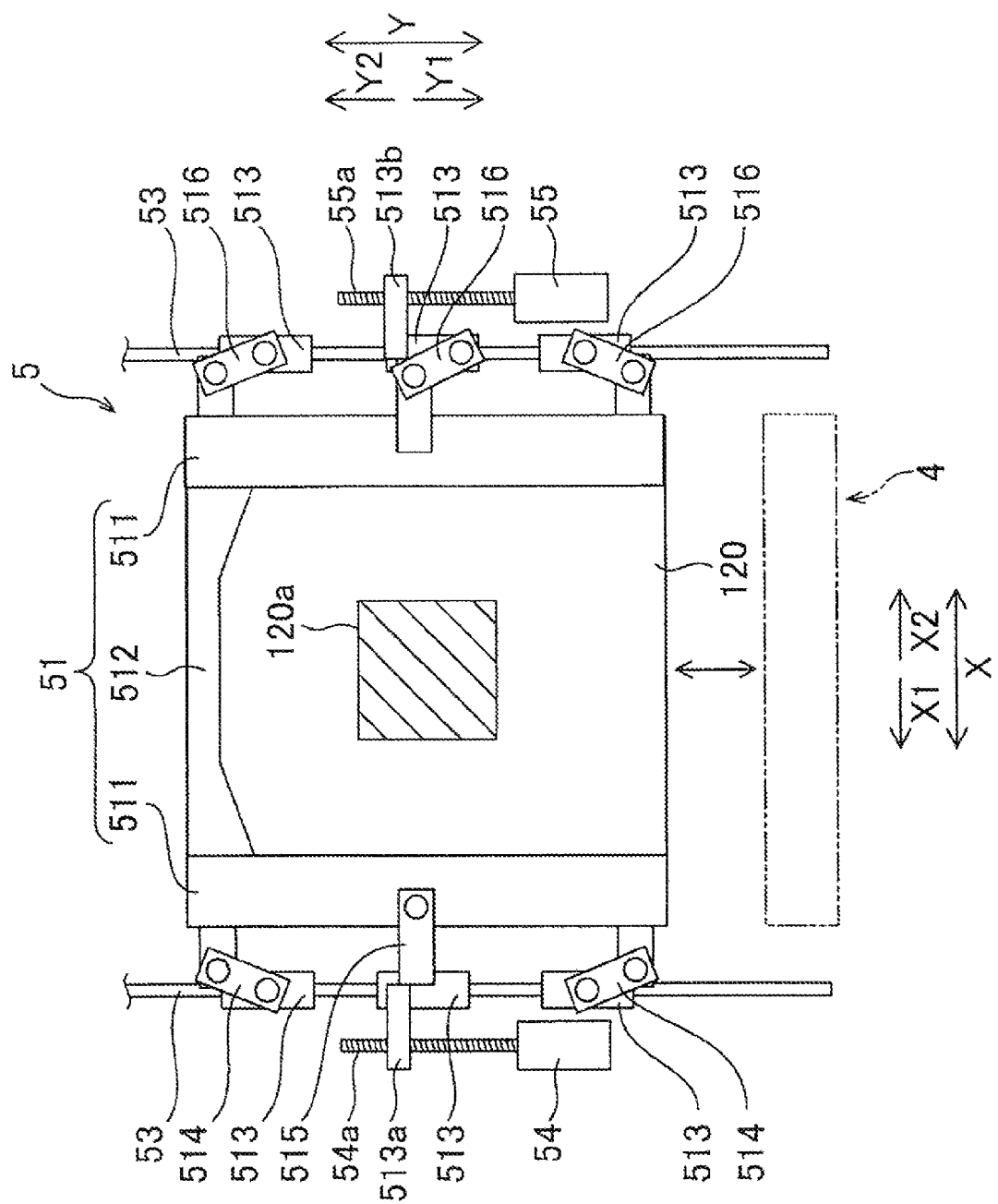
FIG. 4 is a schematic plan view for explaining the structure of the mask table of the printer.

Specifically, as shown in FIG. 4, the main portion 51 is supported on each of the rails 53 by means of three sliders 513 having their respective X-direction opposite ends aligned in the Y-direction. More specifically, Y-axis plate portion 511 of the main portion 51 which is located on the X1-direction side has Y-direction opposite ends connected to their associated sliders 513 via connector members 514 associated therewith. Each of the connector members 514 is pivotally attached to both the associated slider 513 and the Y-axis plate portion 511. The Y-axis plate portion 511 has a Y-direction central portion connected to the associated slider 513 by means of a connector member 515. The connector member 515 is fixedly attached to the associated slider 513 while being pivotally attached to the Y-axis plate portion 511. The center slider 513 to which the connector member 515 is fixed is fixedly fitted with a nut member 513a, which is threadingly engaged with a ball screw 54a to be rotated by a Y-axis driving portion 54 comprising a servo motor.

On the other hand, that Y-axis plate portion 511 of the main portion 51 which is located on the X2-direction side has Y-direction opposite ends and a central portion which are connected to their associated sliders 513 via connector members 516 associated therewith. Each of the connector members 516 is pivotally attached to both the associated slider 513 and the Y-axis plate portion 511. The center slider 513 is fixedly fitted with a nut member 513b, which is threadingly engaged with a ball screw 55a to be rotated by a Y-axis driving portion 55 comprising a servo motor.

Figure 5:
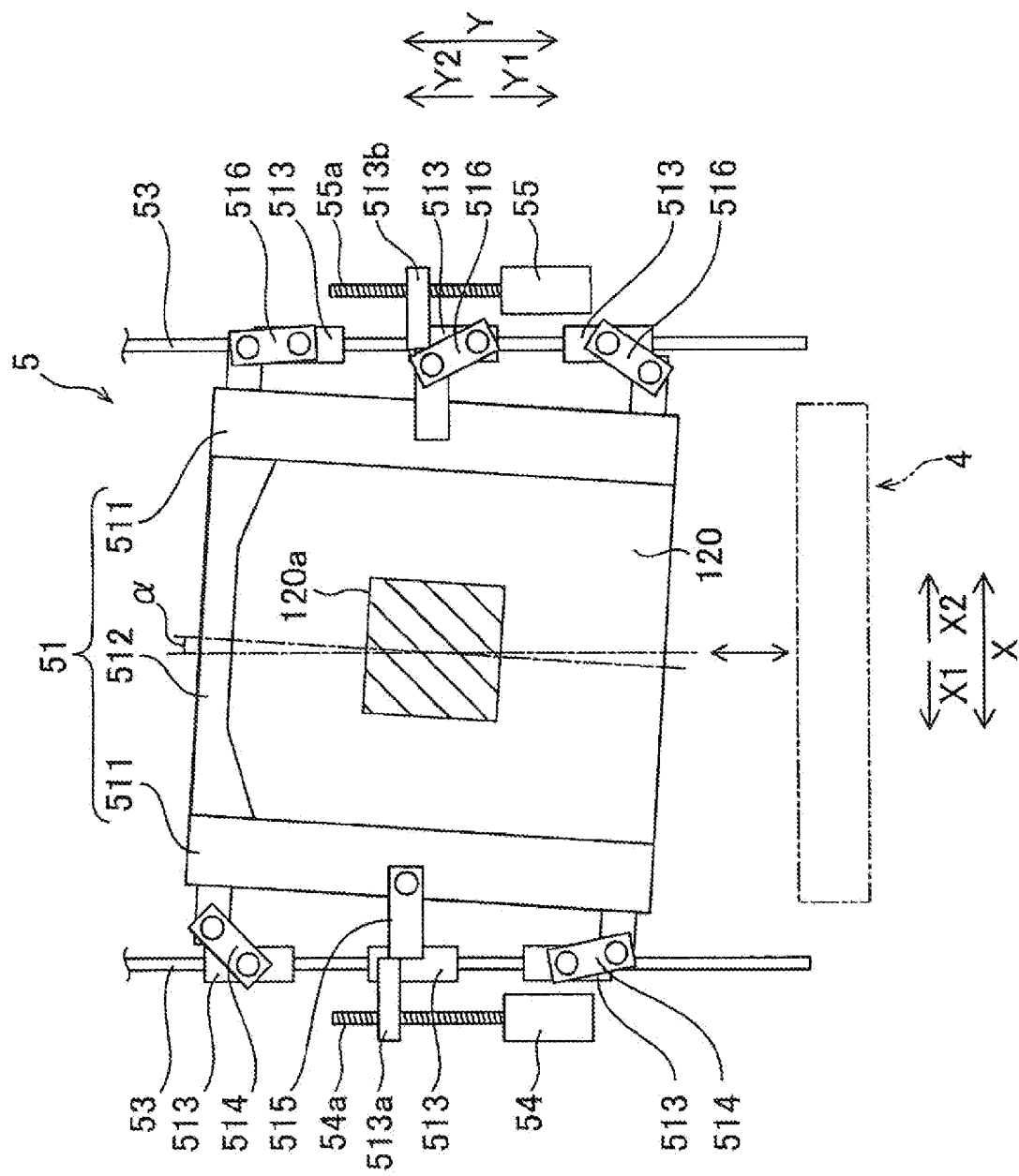
FIG. 5 is a schematic plan view illustrating a mask in a position turned by the mask table.

With the arrangement described above, when the Y-axis driving portions 54 and 55 are driven by an equal amount, the opposite ends of the main portion 51 on the X1-direction side and X2-direction side are moved by an equal amount in the Y-direction and, as a result, the main portion 51 moves linearly in the Y-direction. When the Y-axis driving portions 54 and 55 are driven by different amounts, the opposite ends of the main portion 51 on the X1-direction side and X2-direction side are moved by different amounts in the Y-direction. In this case, the main portion 51 pivots about a pivot point defined by the connecting portion between the Y-axis plate portion 511 on the X1-direction side and the Y-direction center connector member 515, as shown in FIG. 5. That is, the present embodiment is capable of moving the main portion 51 linearly in the Y-direction and causing the main portion 51 to pivot in plan view by controlling the amounts of drive by the Y-axis driving portions 54 and 55. Thus, the mask 120 held by the mask support plate 52 can be moved linearly in the Y-direction or inclined relative to the direction of movement of the cleaner section 4 (Y-direction) in plan view, as will be described later. When the Y-axis driving portions 54 and 55 are driven by an equal amount in opposite directions, the main portion 51 can turn about an axis parallel with the Z-direction without moving in the Y-direction.

As shown in FIG. 3, the mask support plate 52 is shaped into a frame and has an opening portion 521 shaped substantially rectangular in plan view. The mask support plate 52 is coupled to the main portion 51 by means of guide pins 59 and the like described later and is designed to move together with the main portion 51 as the main portion 51 moves. Specifically, the mask support plate 52 moves linearly in the Y-direction together with the main portion 51 as the main portion 51 moves linearly in the Y-direction and turns together with the main portion 51 as the main portion 51 turns in plan view. Thus, it is possible to move the mask 120 held by the mask support plate 52 (see FIG. 3) linearly in the Y-direction and turn the mask 120 in plan view, as shown in FIGS. 4 and 5.

The mask support plate 52 is designed to be vertically movable (in the Z-direction) relative to the main portion 51. The following description is directed to a mechanism for moving the mask support plate 52 up and down in the vertical direction.

As shown in FIG. 3, the pair of Y-axis plate portions 511 of the main portion 51 are each provided with a pair of ball screws 56 extending therethrough. The ball screws 56 each have a lower end portion fitted with a pulley-integrated nut 561. A driving belt 562 is entrained about the pulley-integrated nuts 561 and, hence, the pulley-integrated nuts 561 can be rotated by a Z-axis driving portion 57 comprising a servo motor by means of the driving belt 562. The pulley-integrated nuts 561 are each rotatably fitted on the mask support plate 52 and fixed in the Z-direction. The pair of ball screws 56 have upper end portions fitted with a connector member 58 extending in the Y-direction. The pair of guide pins 59 extending through the associated Y-axis plate portion 511 in the Z-direction have upper ends connected to the connector member 58 and lower ends connected to the mask support plate 52. With this arrangement, the mask support plate 52 is guided by the guide pins 59 to move vertically (in the Z-direction) relative to the main portion 51 as the pulley-integrated nuts 561 are rotated by the Z-axis driving portion 57.

With reference to FIG. 6, description will be made of the internal structure of the printer 100 according to the present embodiment.

As shown in FIG. 6, the printer 100 includes an arithmetic processing section 101 for controlling the entire printer 100, a display unit 102, a storage section 103, a substrate conveyance control section 104, a mask table control section 105, and a cleaner control section 106. The arithmetic processing section 101 is one example of the "control section" defined by the present disclosure.

The arithmetic processing section 101 mainly comprises a CPU and is configured to carry out a printing process based on a printing program stored in the storage section 103. The arithmetic processing section 101 is also configured to cause the cleaner section 4 to carry out a cleaning process based on a cleaning program stored in the storage section 103. The display unit 102 has the function of displaying a variety of information for the user. The display unit 102 comprises a touch panel and the like and, hence, the user can establish settings related to the printing process and cleaning process via the display unit 102. That is, the display unit 102 is one example of the "setting section" defined by the present disclosure. The substrate conveyance control section 104 is configured to control a substrate conveyance operation of the conveyors 12 (see FIG. 1) of the substrate support table 1, operations of a clamp device 14 (see FIG. 1) for clamping and releasing the substrate 110, a moving operation of the base member 10 in the Y-direction and a moving operation of the body portion 11 in the X-direction according to instructions from the arithmetic processing section 101. The mask table control section 105 is configured to control an operation of the mask table 5 according to instructions from the arithmetic processing section 101. Specifically, the mask table control section 105 is configured to control the two Y-axis driving portions 54 and 55 and the Z-axis driving portion 57 according to the instructions from the arithmetic processing section 101. The cleaner control section 106 is configured to control an operation of the cleaner section 4 according to instructions from the arithmetic processing section 101. Specifically, the cleaner control section 106 is configured to control the lift driving portion 431, suction unit 46 and take-up driving portion 452 according to instructions from the arithmetic processing section 101.

An imaging control section 107 performs a control such that a substrate camera 61 and a mask camera 62 are caused to image a fiducial mark on the top surface of the substrate 110 and a fiducial mark on the under surface of the mask 120, respectively, prior to the start of printing and further performs a control such that the mask camera 62 is caused to image the under surface of the opening region 120a of the mask 120 upon completion of printing on a predetermined number of substrates 110. Prior to the start of printing, the arithmetic processing section 101 determines the amount of position gap between the substrate 110 and the mask 120 from the images of the respective fiducial marks taken by the substrate camera 61 and mask camera 62 and controls movement of the body portion 11 of the substrate support table 1 in the X-direction and positions of the main portion 51 of the mask table 5 in the Y-direction and R-direction (direction about an axis parallel with the Z-direction) respectively so as to eliminate the position gap and then performs a control such that the mask support table 52 is moved in the Z-direction to superpose the mask 120 on the substrate 110. Further, the arithmetic processing section 101 controls operations of the cleaner section 4 via the cleaner control section 106 and the like in such a manner that the cleaner section 4 carries out the cleaning process upon completion of printing on a predetermined number of substrates 110 or when the mask 120 is determined to be stained from the result of imaging of the under surface of the mask 120 by the mask camera 62.

With reference to FIGS. 4 and 5, the cleaning process carried out by the printer 100 according to the present embodiment will be described in detail.

The printer 100 according to the present embodiment is capable of carrying out the cleaning process in a plurality of different ways of cleaning in accordance with masks 120. Specifically, as shown in FIG. 4, the arithmetic processing section 101 is capable of performing a control such that the cleaner section 4 is moved along the under surface of the mask 120 in the Y-direction (corresponding to the "predetermined direction" defined by the present disclosure) to carry out the cleaning process on the mask 120, with the mask 120 held by the mask table 5 being positioned along the Y-direction (not inclined relative to the Y-direction). That is, the mask 120 can be cleaned with the opening region 120a thereof (the centerline of the opening region 120a or a pair of parallel lateral sides of the opening region 120a) in a position parallel with the direction of movement (Y-direction) of the cleaner section 4 (position assumed during printing). As shown in FIG. 5, the arithmetic processing section 101 is also capable of performing a control such that the cleaner section 4 is moved along the under surface of the mask 120 in the Y-direction to carry out the cleaning process on the mask 120, with the mask 120 held by the mask table 5 being inclined by a predetermined inclination angle $\alpha$ ($\alpha=2$ degrees for example) relative to the Y-direction in a plane parallel with the under surface thereof by turning in the R-direction. That is, the mask 120 can be cleaned with the opening region 120a of the mask 120 in a position inclined relative to the Y-direction in the plane parallel with the under surface of the mask 120. With the present embodiment, the user can establish a desired setting of the inclination angle $\alpha$ within the range from 0 to 5 degrees via the display unit 102.

In some cases, the mask 120 is inclined relative to the Y-direction which is the direction of movement of the cleaner section 4 by turning the mask 120 side in the R-direction in order for the substrate 110 and the mask 120 to register with each other before printing. In such cases, however, this angle (inclination angle β) is usually very small. Separately from such registration, the printer 100 according to the present embodiment causes the mask 120 to be inclined relative to the Y-direction in the plane parallel with the under surface of the mask 120 in order to perform cleaning. That is, the inclination angle α is larger than the inclination angle β for registration.

The arithmetic processing section 101 is also capable of moving the cleaner section 4 along the under surface of the mask 120 in the Y-direction and changing the inclination angle α halfway through the movement of the cleaner section 4. For example, the arithmetic processing section 101 is capable of performing a control such that the inclination angle α of the mask 120 is changed during cleaning at the time when the cleaner section 4 reaches a predetermined position in the Y-direction. The printer 100 according to the present embodiment allows the user to establish a desired setting of the time to change the inclination angle α of the mask 120 and desired settings of the inclination angle α before and after the change via the display unit 102.

The arithmetic processing section 101 is also capable of changing the inclination angle α of the mask 120 a plurality of times to swing the mask 120 while moving the cleaner section 4 along the under surface of the mask 120 in the Y-direction. That is, the arithmetic processing section 101 is capable of controlling the cleaning while swinging the mask 120 in plan view. In this case, the arithmetic processing section 101 is also capable of performing a control such that the swing amount of the mask 120 is changed during cleaning at the time when the cleaner section 4 reaches a predetermined position in the Y-direction (The swing amount corresponds to a maximum inclination angle $\alpha_0$ formed during swing. The swing is performed in the form of recurring change of the inclination angle α between $-\alpha_0$ and $+\alpha_0$). The arithmetic processing section 101 is also capable of performing a control such that the swing speed of the mask 120 is changed during cleaning at the time when the cleaner section 4 reaches a predetermined position in the Y-direction. The user can also establish desired settings of the time to change the swing amount and the swing speed and desired settings of the swing amount and swing speed before and after the change via the display unit 102. When the swing amount is increased and the swing speed decreased (made slower), the mask 120 moves slowly and largely relative to the cleaner section 4 and, hence, the mask 120 can be cleaned as if the mask 120 were wiped by hand. On the other hand, when the swing amount is decreased and the swing speed increased (made faster), the mask 120 vibrates by moving quickly bit by bit relative to the cleaner section 4. Thus, it is possible to clean the mask 120 in a vibrated state.

The arithmetic processing section 101 is also capable of moving the cleaner section 4 along the under surface of the mask 120 in the Y-direction and reciprocating the mask 120 in the Y1- and Y2-directions (i.e., changing the direction of movement of the cleaner section 4 relative to the mask 120 a plurality of times) halfway through the movement of the cleaner section 4. In this case, the arithmetic processing section 101 is also capable of reciprocating the mask 120 in the Y1- and Y2-directions with the mask 120 in a position inclined by the predetermined inclination angle α relative to the Y-direction. For example, the inclination angle α can be set to $+\alpha_0$ in the case of cleaning by movement of the mask 120 in the Y1-direction and set to $-\alpha_0$ in the case of cleaning by movement of the mask 120 in the Y2-direction. With the present embodiment, the user can establish desired settings of the amount and speed of reciprocating movement of the mask 120 in the Y1- and Y-2 directions via the display unit 102. Thus, it is possible to reciprocate the mask 120 in the Y-direction either slowly or bit by bit to produce a vibration. The arithmetic processing section 101 is also capable of changing the way of cleaning (i.e., the details of control over the cleaning operation) between the stroke of movement of the cleaner section 4 in the Y2-direction and the stroke of movement of the cleaner section 4 in the Y1-direction. With the present embodiment, the user can establish desired settings of the way of cleaning via the display unit 102 and, hence, the arithmetic processing section 101 carries out the cleaning process according to the settings of the way of cleaning established by the user.

In cleaning the mask 120, the present embodiment is capable of cleaning the mask 120 in a position inclined relative to the Y-direction in plan view as described above. For this reason, even when a sufficient cleaning effect cannot be obtained on the mask 120 in a position not inclined relative to the Y-direction, the present embodiment can effectively clean the mask 120 by inclining the mask 120 relative to the Y-direction to change the position of the opening portion of the mask 120 relative to the direction of movement of the cleaner section 4 (Y-direction). Therefore, as compared with a conventional printer of this type in which the mask is constantly held in a fixed direction relative to the direction of movement of the cleaner section (cleaning section), the present embodiment is capable of cleaning the mask 120 more effectively.

According to the present embodiment, the arithmetic processing section 101 is configured to move the cleaner section 4 along the under surface of the mask 120 in the Y-direction and change the inclination angle α of the mask 120 halfway through the movement of the cleaner section 4. Such a configuration makes it possible to change the position of the opening portion of the mask 120 relative to the direction of movement of the cleaner section 4 while moving the cleaner section 4. For this reason, as compared with cases where the position of the opening portion of the mask 120 is fixed (i.e., cases where a certain inclination angle α is held constant), the cleaning performance can be improved.

According to the present embodiment, the arithmetic processing section 101 is configured to move the cleaner section 4 along the under surface of the mask 120 in the Y-direction and perform a control such that the mask 120 is caused to swing halfway through the movement of the cleaner section 4. With such a configuration, the cleaner section 4 and the mask 120 can be moved in the swing direction as well as in the Y2-direction and, hence, the cleaning performance can be improved further.

With respect to the swinging action of the mask 120 described above, the arithmetic processing section 101 according to the present embodiment is further configured to perform a control such that the swing speed of the mask 120 is changed. With such a configuration, the mask 120 can be cleaned either as if the mask 120 were wiped by hand when the swing speed of the mask 120 is decreased (made slower) or in such a manner that solder paste adhering to the opening portion of the mask 120 is scraped off when the swing speed of the mask 120 is increased (made faster).

With respect to the swinging action of the mask 120 described above, the arithmetic processing section 101 is configured to perform a control such that the swing amount (maximum inclination angle) of the mask 120 is changed. This configuration enables the mask 120 to be cleaned while increasing and decreasing the inclination angle α of the mask 120 relative to the Y-direction in which the cleaner section 4 moves. For this reason, the mask 120 can be effectively cleaned by adaptation to opening patterns of the mask 120.

According to the present embodiment, the arithmetic processing section 101 is configured to reciprocate the mask 120 in the Y-direction (i.e., change the direction of movement of the cleaner section 4 relative to the mask 120 a plurality of times) with the mask 120 in a position inclined relative to the Y-direction in plan view while moving the cleaner section 4 along the under surface of the mask 120 in the Y-direction. This configuration enables the mask 120 to be cleaned effectively by causing the mask 120 inclined relative to the Y-direction to reciprocate in the Y-direction.

According to the present embodiment, the arithmetic processing section 101 is configured to perform a control such that the inclination angle α of the mask 120 relative to the Y-direction and the way of inclining the mask 120 (with respect to the swing amount, swing speed and the like) are changed between the stroke of movement of the cleaner section 4 in the Y2-direction and the stroke of movement of the cleaner section 4 in the Y1-direction. That is, the arithmetic processing section 101 is configured to change the details of control over the cleaning operation on the mask 120. This configuration makes it possible to establish settings of the inclination angle α and way of inclining the mask 120 which are suitable for the respective strokes of movement of the cleaner 4 in the Y2- and Y1-directions, thereby to clean the mask 120 more effectively.

The printer 100 according to the present embodiment allows the user to establish settings of the inclination angle α of the mask 120 relative to the Y-direction and settings of the way of inclining the mask 120 (with respect to the swing amount, swing speed and the like) via the display unit 102 for the cleaner section 4 to clean the mask 120. This configuration enables the mask 120 to be cleaned with settings of the inclination angle and way of inclination (the way of cleaning) established by the user to suit the mask.

The embodiment disclosed herein should be construed to be illustrative and not limitative in all points. The scope of the present disclosure is defined by the claims, not by the description of the foregoing embodiment and covers all changes and modifications within the scopes of claims and within the meanings and scopes of equivalents.

For example, the foregoing embodiment has the configuration for cleaning the mask by moving the cleaner section in the Y-direction as one exemplary configuration for moving the cleaner section relative to the mask. However, the present disclosure is not limited thereto. The present disclosure may adopt either a configuration for moving the mask holding section in the Y-direction with the cleaner section failing to move in the Y-direction, thereby moving the cleaner section relative to the mask to perform cleaning or a configuration for moving both of the cleaner section and the mask holding section in the Y-direction, thereby moving the cleaner section relative to the mask to perform cleaning.

The foregoing embodiment has the configuration for inclining the mask relative to the Y-direction by turning the mask by means of the mask table serving as the mask holding section of the present disclosure. However, the present disclosure is not limited thereto. The present disclosure may adopt a configuration for inclining the mask by any operation other than turning as long as the mask can be inclined in a predetermined direction by the mask holding section.

Unlike the printer 100 according to the foregoing embodiment, a printer of the type in which an R-direction driving device for registration is provided on the substrate support table 1 side fails to allow the mask 120 to be inclined relative to the Y-direction which is the direction of movement of the cleaner section 4 even when registration is performed.

The present disclosure described above is summarized as follows.

A printer according to one aspect of the present disclosure includes: a mask; a cleaning section configured to perform cleaning of the mask by movement relative to the mask in a predetermined direction parallel with an under surface of the mask; a mask holding section capable of displacing the mask about an axis perpendicular to the under surface of the mask while holding the mask; and a control section configured to control the mask holding section in such a manner that the cleaning is performed on the mask placed in a predetermined position about the axis. More specifically, the printer further includes a printing mechanism section configured to carry out a printing process, wherein the control section controls the mask holding section in such a manner that the mask is positioned parallel with the predetermined direction in a plane parallel with the under surface during printing by the printing mechanism section, and is inclined in the plane by a predetermined inclination angle relative to the predetermined direction during the cleaning.

In cleaning the mask, this printer is capable of performing cleaning of the mask in a position inclined relative to the predetermined direction (the direction of movement of the cleaning section relative to the mask) in the plane parallel with the under surface of the mask. For this reason, even when a sufficient cleaning effect cannot be obtained on the mask in a position not inclined relative to the predetermined direction (for example a position in which the lateral sides of a rectangular mask or the lateral sides of a rectangular opening region for printing defined in a mask are positioned parallel with the predetermined direction), the printer can incline the mask relative to the predetermined direction in the plane parallel with the under surface of the mask to change the position of the opening portion of the mask relative to the direction of movement of the cleaning section (the predetermined direction), thereby making it possible to clean the mask effectively.

In the printer, the control section performs a control such that the inclination angle of the mask is changed halfway through the relative movement of the cleaning section.

This feature makes it possible to move the cleaning section relative to the mask and change the position of the opening portion of the mask relative to the direction of movement of the cleaning section (the predetermined direction) halfway through the relative movement of the cleaning section. For this reason, the cleaning performance can be improved as compared with cases where the position of the opening portion of the mask is fixed (cases where the inclination angle of the mask is held constant).

In this case, the control section preferably performs a control such that the mask is caused to swing by changing the inclination angle of the mask a plurality of times halfway through the relative movement of the cleaning section.

This feature makes it possible to further improve the cleaning performance because the cleaning section and the mask can be moved relative to each other in the swing direction as well as in the predetermined direction.

In the configuration for swinging the mask, it is more preferable that the control section performs a control such that a swing speed of the mask is changed halfway through the relative movement of the cleaning section.

With this feature, when the swing speed of the mask is decreased (made slower), the mask can be cleaned as if the mask were wiped by hand. When the swing speed is increased (made faster), on the other hand, the mask can be cleaned in such a manner that the object to be removed (including solder and the like) which is adhering to the opening portion of the mask is scraped off. Thus, the cleaning performance can be further improved.

In the configuration for swinging the mask, it is more preferable that the control section performs a control such that a maximum swing angle of the mask is changed halfway through the relative movement of the cleaning section.

This feature enables the mask to be cleaned by increasing and decreasing the inclination angle of the mask relative to the predetermined direction and hence makes it possible to clean the mask effectively by adaptation to opening patterns of the mask.

In each of the printers described above, it is preferable that the control section performs a control such that the cleaning section performs a reciprocating movement of changing a moving direction thereof relative to the mask a plurality of times in a direction parallel with the predetermined direction halfway through the relative movement of the cleaning section.

This feature enables the mask to move back and forth in the predetermined direction (the direction of relative movement of the mask), thereby making it possible to clean the mask effectively.

In each of the printers described above, it is preferable that the control section further performs a control over the movement of the cleaning section such that the cleaning section is caused to perform relative movement in the predetermined direction to clean the mask and then perform relative movement in a direction opposite to the predetermined direction to clean the mask, and details of operation performed by at least one of the mask holding section and the cleaning section during the cleaning are changed between the cleaning by the relative movement of the cleaning section in the predetermined direction and the cleaning by the relative movement of the cleaning section in the opposite direction.

This feature enables the mask to be cleaned more effectively by previously establishing settings of the cleaning operation which are suitable for the respective relative movements of the cleaning section in the predetermined direction and in the direction opposite to the predetermined direction, i.e., settings of the inclination angle of the mask and settings of the way of inclining the mask (with respect to the swing speed, maximum swing angle and the like).

Preferably, each of the printers described above further includes a setting section which allows a user to set details of the operation performed by at least one of the mask holding section and the cleaning section during the cleaning.

This feature allows desired settings of the details of control suitable for the mask, i.e., control on the inclination angle of the mask and the way of inclining the mask, to be set as desired by utilizing the experience of the user and the like and, as a result, the mask can be cleaned more effectively.

INDUSTRIAL APPLICABILITY

As described above, the printer according to the present disclosure is capable of cleaning the mask more effectively and hence contributes to improvement in the quality of printing of solder or the like on a printed board through the improvement in cleaning performance. Therefore, the printer is useful particularly for the manufacture of component mounting boards.

The invention claimed is:

1. A printer comprising:
   a mask;
   a cleaning section configured to perform cleaning of the mask by movement relative to the mask in a predetermined direction parallel with an under surface of the mask;
   a mask holding section capable of displacing the mask about an axis perpendicular to the under surface of the mask while holding the mask;
   a control section configured to control the mask holding section in such a manner that the cleaning is performed on the mask placed in a predetermined position about the axis; and
   a printing mechanism section configured to carry out a printing process,
   the control section controlling the mask holding section in such a manner that the mask is positioned parallel with the predetermined direction in a plane parallel with the under surface during printing by the printing mechanism section, and being inclined in the plane by a predetermined inclination angle relative to the predetermined direction during the cleaning.

2. The printer according to claim 1 wherein the control section performs a control such that the inclination angle of the mask is changed halfway through the relative movement of the cleaning section.

3. The printer according to claim 2, wherein the control section performs a control such that the mask is caused to swing by changing the inclination angle of the mask a plurality of times halfway through the relative movement of the cleaning section.

4. The printer according to claim 3, wherein the control section performs a control such that a swing speed of the mask is changed halfway through the relative movement of the cleaning section.

5. The printer according to claim 3, wherein the control section performs a control such that a maximum swing angle of the mask is changed halfway through the relative movement of the cleaning section.

6. The printer according to claim 1, wherein
   the control section performs a control such that both of the cleaning section and the mask holding section are caused to move in a direction parallel with the predetermined direction during the cleaning.

7. A printer comprising:
   a mask;
   a cleaning section configured to perform cleaning of the mask by movement relative to the mask in a predetermined direction parallel with an under surface of the mask;
   a mask holding section capable of displacing the mask about an axis perpendicular to the under surface of the mask while holding the mask;
   a control section configured to control the mask holding section in such a manner that the cleaning is performed on the mask placed in a predetermined position about the axis; and
   a setting section which allows a user to set details of operation performed by at least one of the mask holding section and the cleaning section during the cleaning, the control section controls the mask holding section in such a manner that the mask is inclined in a plane parallel with the under surface of the mask by a predetermined inclination angle relative to the predetermined direction, and the setting section being capable of setting the inclination angle by the user.

8. The printer according to claim 7, wherein the control section performs a control such that the mask is caused to swing by changing the inclination angle of the mask a plurality of times halfway through the relative movement of the cleaning section, and the setting section is capable of setting at least one of a swing amount and a swing speed of the mask by the user.

9. The printer according to claim 7, wherein the setting section is capable of setting at least one of a relative moving amount and a relative moving speed of the cleaning section relative to the mask by the user.

10. A printer comprising:

a mask;

a cleaning section configured to perform cleaning of the mask by movement relative to the mask in a predetermined direction parallel with an under surface of the mask;

a mask holding section capable of displacing the mask about an axis perpendicular to the under surface of the mask while holding the mask; and a control section configured to control the mask holding section in such a manner that the cleaning is performed on the mask placed in a predetermined position about the axis;

the control section performs a control such that the cleaning section performs a reciprocating movement of changing a moving direction thereof relative to the mask a plurality of times in a direction parallel with the predetermined direction halfway through the relative movement of the cleaning section, the control section controlling the mask holding section in such a manner that the mask is inclined in a plane parallel with the under surface of the mask by a predetermined inclination angle relative to the predetermined direction during the reciprocating movement.

11. The printer according to claim 10, wherein the control section changes the inclination angle during the reciprocating movement between an operation of causing the cleaning section to perform relative movement in the predetermined direction, and an operation of causing the cleaning section to perform relative movement in a direction opposite to the predetermined direction.

12. The printer according to claim 11, further comprising:

a setting section which allows a user to set the inclination angle of the mask during the reciprocating movement.

13. The printer according to claim 10, wherein the control section changes an amount of reciprocating movement during the reciprocating movement.

14. The printer according to claim 10, wherein the control section changes a speed of reciprocating movement during the reciprocating movement.

15. The printer according to claim 10, further comprising:

a setting section which allows a user to set at least one of an amount of reciprocating movement and a speed of reciprocating movement.

16. A printer comprising:

a mask;

a cleaning section configured to perform cleaning of the mask by movement relative to the mask in a predetermined direction parallel with an under surface of the mask;

a mask holding section capable of displacing the mask about an axis perpendicular to the under surface of the mask while holding the mask; and a control section configured to control the mask holding section in such a manner that the cleaning is performed on the mask placed in a predetermined position about the axis;

the control section further performing a control over the movement of the cleaning section such that the cleaning section is caused to perform relative movement in the predetermined direction to clean the mask and then perform relative movement in a direction opposite to the predetermined direction to clean the mask, and details of operation performed by at least one of the mask holding section and the cleaning section during the cleaning are changed between the cleaning by the relative movement of the cleaning section in the predetermined direction and the cleaning by the relative movement of the cleaning section in the opposite direction, the control section controlling the mask holding section to change an inclination angle of the mask in a plane parallel with the under surface of the mask relative to the predetermined direction between an operation of causing the cleaning section to perform relative movement in the predetermined direction, and an operation of causing the cleaning section to perform relative movement in a direction opposite to the predetermined direction.

* * * * *